(12) United States Patent
Choi et al.

(10) Patent No.: US 9,929,184 B2
(45) Date of Patent: Mar. 27, 2018

(54) ARRAY SUBSTRATE AND FABRICATION METHOD THEREOF, AND DISPLAY PANEL

(71) Applicant: BOE TECHNOLOGY GROUP CO., LTD., Beijing (CN)

(72) Inventors: Seungjin Choi, Beijing (CN); Youngjin Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/768,967

(22) PCT Filed: Nov. 14, 2014

(86) PCT No.: PCT/CN2014/091121
§ 371 (c)(1),
(2) Date: Aug. 19, 2015

(87) PCT Pub. No.: WO2016/029557
PCT Pub. Date: Mar. 3, 2016

(65) Prior Publication Data
US 2016/0247824 A1    Aug. 25, 2016

(30) Foreign Application Priority Data
Aug. 25, 2014 (CN) ............ 2014 1 0421632

(51) Int. Cl.
*H01L 27/12*    (2006.01)
(52) U.S. Cl.
CPC ......... *H01L 27/124* (2013.01); *H01L 27/127* (2013.01); *H01L 27/1222* (2013.01); *H01L 27/1259* (2013.01); *H01L 27/1288* (2013.01)
(58) Field of Classification Search
None
See application file for complete search history.

(56) References Cited

U.S. PATENT DOCUMENTS

2002/0020838 A1* 2/2002 Yoo ............... G02F 1/1368
257/49
2002/0057393 A1* 5/2002 Park ............... G02F 1/13458
349/43

(Continued)

FOREIGN PATENT DOCUMENTS

CN    1551367 A    12/2004
CN    101009248 A    8/2007

(Continued)

OTHER PUBLICATIONS

International Search Report with English translation and Written Opinion dated May 27, 2015; PCT/CN2014/091121.

(Continued)

*Primary Examiner* — Fei Fei Yeung Lopez
(74) *Attorney, Agent, or Firm* — Ladas & Parry LLP

(57) ABSTRACT

An array substrate and a fabrication method thereof, and a display panel are provided. The array substrate includes a thin film transistor, and the fabrication method includes: forming an intermediate pattern; forming a pattern including a source electrode and a drain electrode of the thin film transistor, the source electrode of the thin film transistor being located on a source electrode ohmic contact region, and the drain electrode of the thin film transistor being located on a drain electrode ohmic contact region; forming a transparent electrode material layer, the transparent electrode material layer covering a substrate including the pattern of the source electrode and the drain electrode of the thin film transistor; patterning the transparent electrode material layer, to obtain a pattern including the pixel electrode; and patterning the intermediate pattern, to remove a channel ohmic contact region, and to remove a portion of a material of the channel active pattern region, so as to form an active layer of the thin film transistor and avoid effec- (Continued)

tively the residue 10a of the transparent electrode material or an organic matter left on the channel active pattern region.

11 Claims, 5 Drawing Sheets

(56) References Cited

U.S. PATENT DOCUMENTS

| | | | |
|---|---|---|---|
| 2002/0105030 A1* | 8/2002 | You | G02F 1/136227 257/347 |
| 2004/0222421 A1 | 11/2004 | Lee et al. | |
| 2010/0032679 A1* | 2/2010 | Kawae | H01L 27/1214 257/72 |
| 2011/0001897 A1 | 1/2011 | Sakai | |
| 2012/0043543 A1* | 2/2012 | Saito | H01L 29/66765 257/57 |
| 2012/0052625 A1* | 3/2012 | Yamazaki | H01L 27/1214 438/104 |
| 2015/0263050 A1* | 9/2015 | Hsu | H01L 27/1288 257/72 |
| 2015/0318362 A1 | 11/2015 | Wang et al. | |

FOREIGN PATENT DOCUMENTS

| | | |
|---|---|---|
| CN | 103715096 A | 4/2014 |
| CN | 103972245 A | 8/2014 |

OTHER PUBLICATIONS

First Chinese Office Action dated Jul. 14, 2016; Appln. No. 201410421632.5.
Third Chinese Office Action dated Apr. 20, 2017; Appln. No. 201410421632.5.
Second Chinese Office Action dated Feb. 13, 2017; Appln. No. 201410421632.5.

* cited by examiner

A-A

ARRAY SUBSTRATE AND FABRICATION METHOD THEREOF, AND DISPLAY PANEL

TECHNICAL FIELD

Embodiments of the present disclosure relate to an array substrate and a fabrication method thereof, and a display panel.

BACKGROUND

FIG. 1 and FIG. 2 show partial schematic diagrams of an array substrate. As shown in the diagrams, the array substrate comprises a thin film transistor; the thin film transistor includes an active layer 40, a channel region 41 formed in the active layer 40, an ohmic contact layer 51 and an ohmic contact layer 52 disposed on the active layer 40, a drain electrode 20 disposed on the ohmic contact layer 51 and a source electrode 30 disposed on the ohmic contact layer 52; and the drain electrode 20 is electrically connected with a pixel electrode 10.

SUMMARY

At least one embodiment of the present disclosure provides an array substrate and a fabrication method thereof, and a display panel comprising the array substrate; in the fabrication method for the array substrate, there is no residue left above the channel region, which improves reliability of the thin film transistor and improves a product yield.

At least one embodiment of the present disclosure provides a fabrication method of an array substrate, and the array substrate comprises a thin film transistor. The fabrication method of the array substrate comprises: forming an intermediate pattern, the intermediate pattern including an active pattern and an ohmic contact pattern located on the active pattern, the active pattern including a source electrode active pattern region, a drain electrode active pattern region, and a channel active pattern region located between the source electrode active pattern region and the drain electrode active pattern region, the ohmic contact pattern region including a source electrode ohmic contact region located on the source electrode active pattern region, a drain electrode ohmic contact region located on the drain electrode active pattern region, and a channel ohmic contact region located on the channel active pattern region; forming a pattern including a source electrode and a drain electrode of the thin film transistor, the source electrode of the thin film transistor being located on the source electrode ohmic contact region, and the drain electrode of the thin film transistor being located on the drain electrode ohmic contact region; forming a transparent electrode material layer, the transparent electrode material layer covering a substrate including the pattern of the source electrode and the drain electrode of the thin film transistor; patterning the transparent electrode material layer, to obtain a pattern including a pixel electrode; and patterning the intermediate pattern, to remove the channel ohmic contact region, and to remove a portion of a material of the channel active pattern region, so as to form an active layer of the thin film transistor.

For example, the process of patterning the transparent electrode material layer may include: forming a first photoresist layer on the transparent electrode material layer; photoetching the first photoresist layer by a first mask, to form a pattern corresponding to the pixel electrode in the first photoresist layer; etching the transparent electrode material layer according to the pattern of the first photoresist layer corresponding to the pixel electrode, to obtain the pattern of the pixel electrode.

For example, the process of patterning the intermediate pattern may include: forming a second photoresist layer on the pattern including the pixel electrode; photoetching the second photoresist layer by a second mask, to form a pattern corresponding to the active layer of the thin film transistor and an ohmic contact layer in the second photoresist layer; etching the intermediate pattern according to the pattern of the second photoresist layer corresponding to the active layer of the thin film transistor and the ohmic contact layer, to form a pattern including the active layer of the thin film transistor and a pattern including the ohmic contact layer.

For example, the process of patterning the transparent electrode material layer and the intermediate pattern synchronously may include: forming a third photoresist layer on the transparent electrode material layer; photoetching the third photoresist layer, to form a pattern corresponding to the pixel electrode, the active layer of the thin film transistor and the ohmic contact layer; etching the transparent electrode material layer and the intermediate pattern, according to the pattern of the third photoresist layer corresponding to the pixel electrode, the active layer of the thin film transistor and the ohmic contact layer, to obtain a pattern including the active layer of the thin film transistor, the pixel electrode and the ohmic contact layer.

For example, the process of forming the intermediate pattern may include: forming an active layer thin film and an ohmic contact layer thin film located on the active layer thin film; and patterning the active layer thin film and the ohmic contact layer thin film, to form the intermediate pattern.

For example, the process of forming the intermediate pattern and the forming the pattern including the source electrode and the drain electrode of the thin film transistor synchronously may include: forming a semiconductor layer; doping the semiconductor layer, to form an active semiconductor layer and the doped layer located on the active semiconductor layer, a composition of the active semiconductor layer being same as that of the semiconductor layer; forming a source-drain metal layer above the doped layer; forming a fourth photoresist layer on the source-drain metal layer; photoetching the fourth photoresist layer by using a half-tone mask, to form a pattern corresponding to the source electrode and the drain electrode of the thin film transistor and the intermediate pattern; etching the source-drain metal layer, the doped layer and the active semiconductor layer, according to the pattern of the fourth photoresist layer corresponding to the source electrode and the drain electrode of the thin film transistor and the intermediate pattern, to obtain a pattern including the source electrode and the drain electrode of the thin film transistor and the intermediate pattern.

For example, the active semiconductor layer has a thickness between 1500 Å and 2300 Å.

For example, in patterning the intermediate pattern, after the channel ohmic contact region is removed, a removed portion of a material of the channel active pattern region has a thickness between 900 Å and 1100 Å.

At least one embodiment of the present disclosure provides an array substrate, and the array substrate is fabricated by using the fabrication method provided by the above-described embodiments of the present disclosure.

For example, a channel region of the thin film transistor has a thickness between 500 Å and 1500 Å.

At least one embodiment of the present disclosure provides a display panel, the display panel comprises an array substrate, and the array substrate is the array substrate provided by the above-described embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

| Reference signs: | |
|---|---|
| 10: pixel electrode | 20: drain electrode |
| 30: source electrode | 40: active layer |
| 41: channel region | 51: ohmic contact layer |
| 52: ohmic contact layer | 10a: residue |
| C: ohmic contact pattern | D: an active pattern |
| E: transparent electrode material layer | F: third photoresist layer |
| C1: drain electrode ohmic contact region | C2: channel ohmic contact region |
| C3: source electrode ohmic contact region | D1: drain electrode active pattern region |
| D2: channel active pattern region | |
| D3: source electrode active pattern region | |
| 60: gate electrode | 70: gate insulating layer |

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
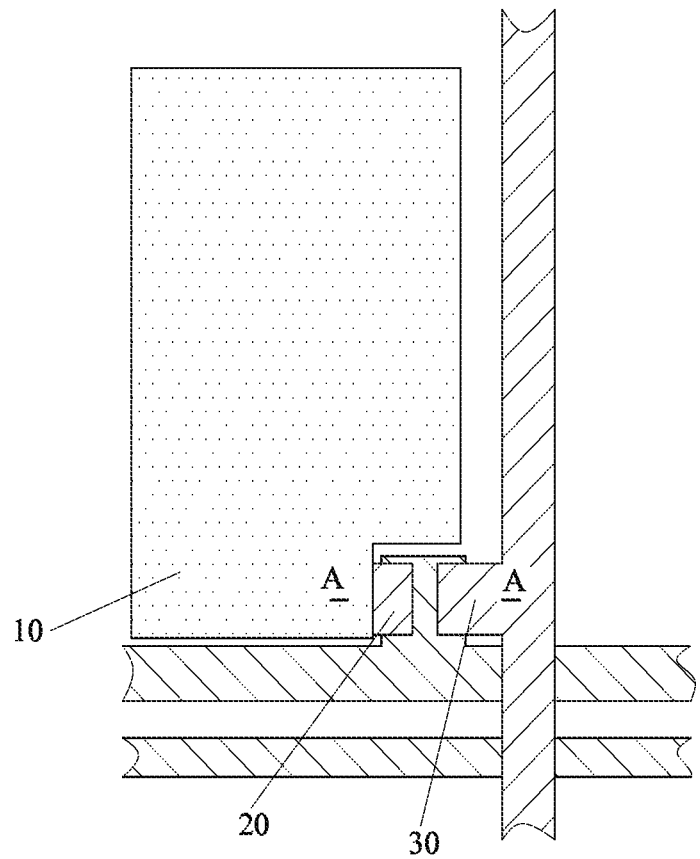
FIG. 1 is a partial schematic diagram of an array substrate.
Figure 2:
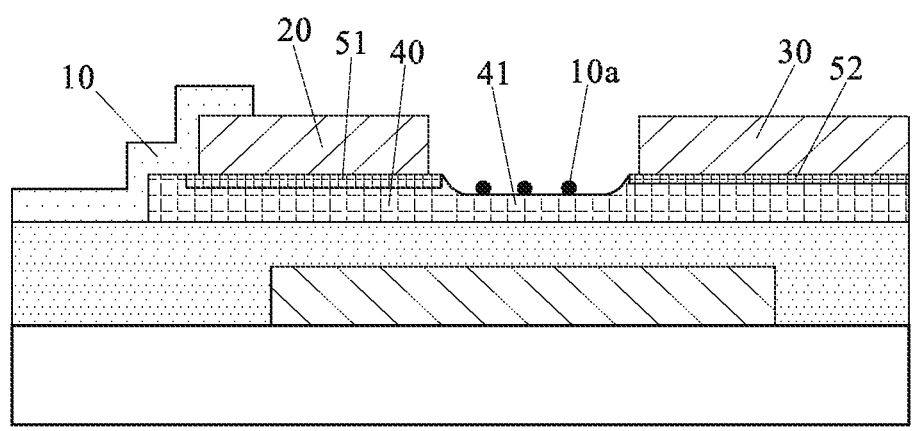
FIG. 2 is a cross-sectional view obtained along line A-A in FIG. 1.
Figure 3:
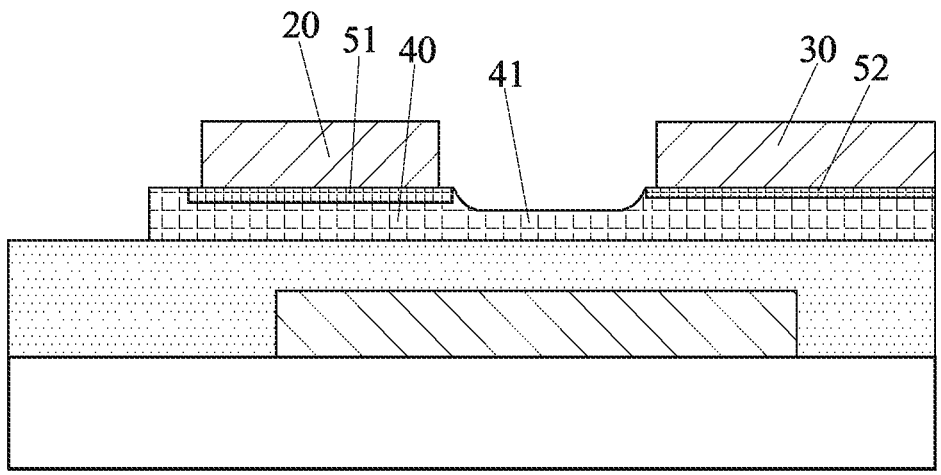
FIG. 3 is an intermediate structure for forming the array substrate as shown in FIG. 2.

As shown in FIG. 2, an ohmic contact layer 51 and an ohmic contact layer 52 are obtained by etching a doped layer (i.e., an N+ layer). FIG. 3 is an intermediate structure of an array substrate formed before a pixel electrode is formed by deposition, and as shown in FIG. 3, an active layer 40, a channel region 41, the ohmic contact layer 51 and the ohmic contact layer 52 have been formed in the intermediate structure. Subsequently, a transparent electrode material layer is deposited on the intermediate structure in FIG. 3, and a pixel electrode 10 is obtained by etching the transparent electrode material layer. In the procedure of forming the pixel electrode 10 by etching the transparent electrode material layer, a transparent electrode material usually cannot be completely etched away, that is, the residue 10*a* of the transparent electrode material or an organic matter (e.g., photoresist) is easily left on a channel region 41, which reduces reliability of the thin film transistor, and also reduces the product yield. Therefore, how to prevent the residue from being formed on the channel region 41 becomes a technical problem to be urgently solved in the art.

Figure 4:
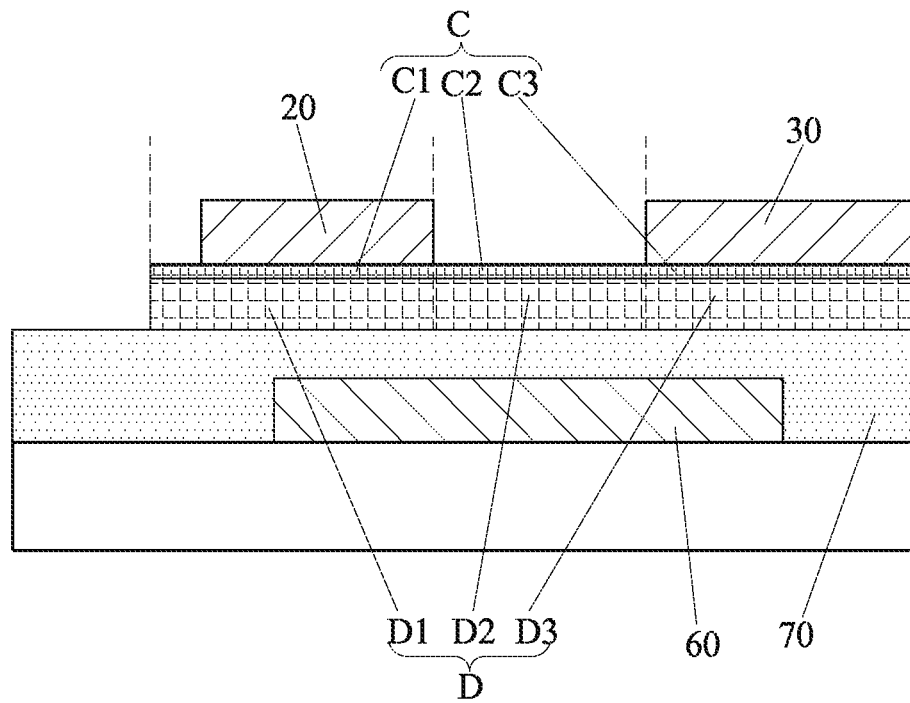
FIG. 4 to FIG. 8 show a schematic diagram of the intermediate structure at different stages, when the array substrate is fabricated by the fabrication method provided by an embodiment of the present disclosure.
Figure 5:
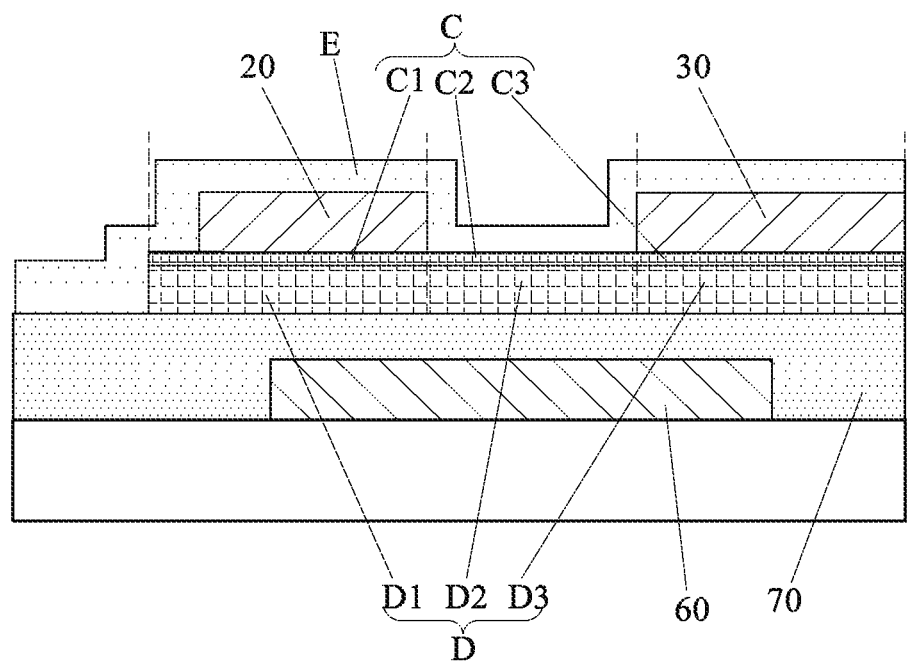

At least one embodiment of the present disclosure provides a fabrication method of an array substrate, the array substrate comprising a thin film transistor; as shown in FIG. 4, the fabrication method of the array substrate may be described as follows.

An intermediate pattern is formed. The intermediate pattern includes an active pattern D and an ohmic contact pattern C located on the active pattern D; the active pattern D includes a source electrode active pattern region D3, a drain electrode active pattern region D1, and a channel active pattern region D2 located between the source electrode active pattern region D3 and the drain electrode active pattern region D1; the ohmic contact pattern C includes a source electrode ohmic contact region C3 located on the source electrode active pattern region D3, a drain electrode ohmic contact region C1 located on the drain electrode active pattern region D1, and a channel ohmic contact region C2 located on the channel active pattern region D2.

A pattern including a source electrode 30 and a drain electrode 20 of the thin film transistor is formed; the source electrode 30 of the thin film transistor is located on the source electrode ohmic contact region C3, and the drain electrode 20 is located on the drain electrode ohmic contact region C1.

A transparent electrode material layer E is formed; the transparent electrode material layer E covers the substrate having included the pattern of the source electrode 30 and the drain electrode 20 of the thin film transistor.

The transparent electrode material layer E is patterned to obtain a pattern including a pixel electrode 10.

Figure 7:
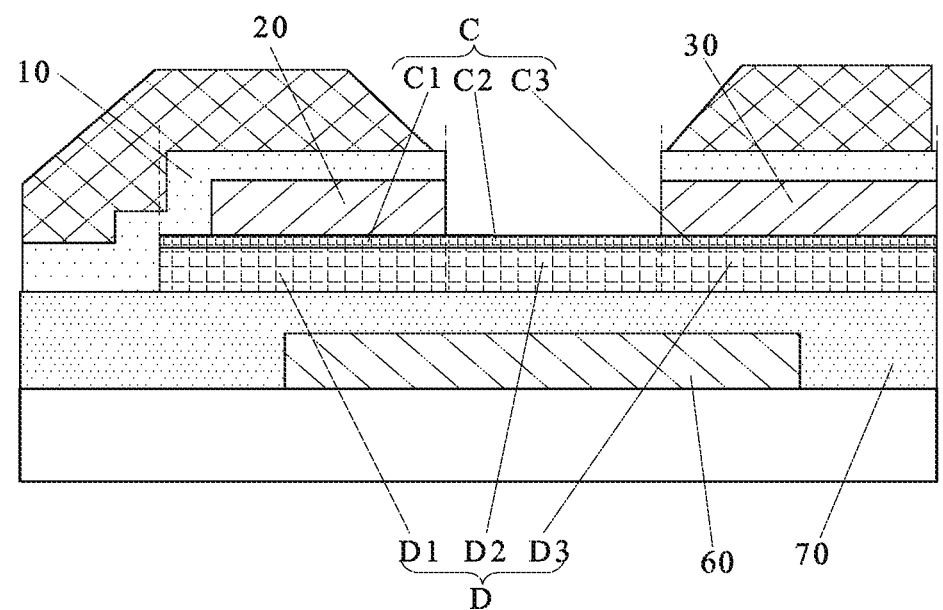
Figure 8:
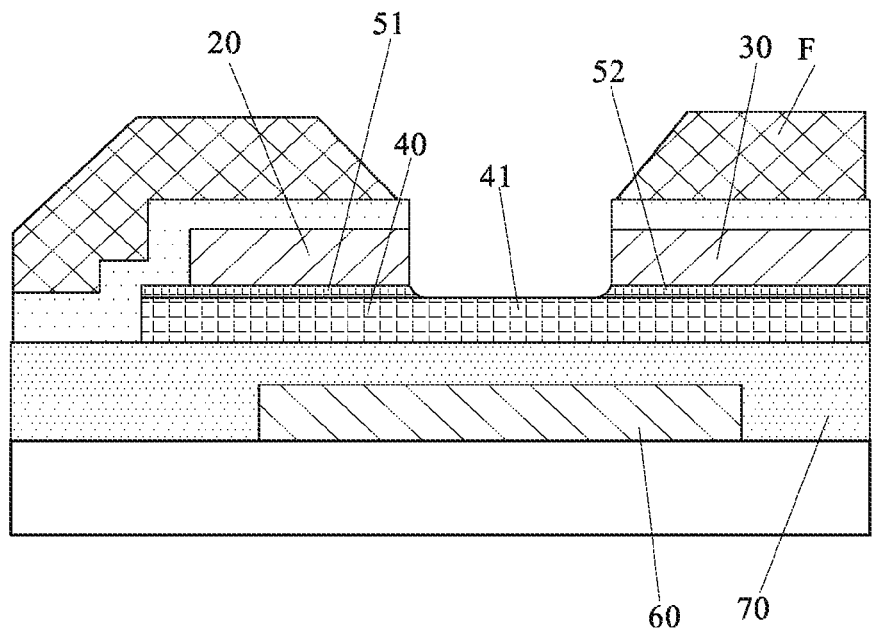
Figure 9:
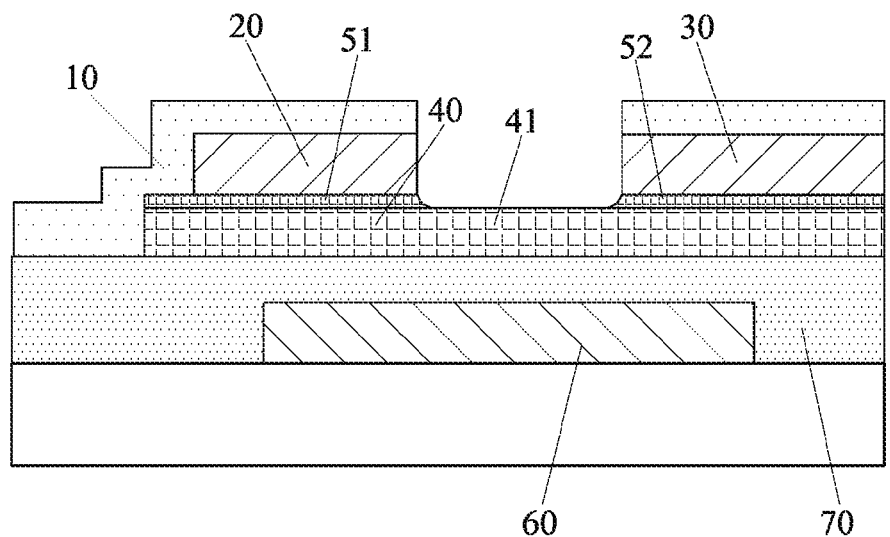
FIG. 9 is a schematic diagram of an array substrate provided by an embodiment of the present disclosure.

The intermediate pattern is patterned to remove the channel ohmic contact region C2 and to remove a portion of the material of the channel active pattern region D2, so as to form an active layer 40 of the thin film transistor (see FIG. 7 to FIG. 9).

It is easily understood that, in the active pattern D, the source electrode active pattern region D3, the channel active pattern region D2 and the drain electrode active pattern region D1 are continuous; in FIG. 4, a dashed line represents only an approximate border of the active pattern region D3, the channel active pattern region D2 and the drain electrode active pattern region D1 as described above, rather than a strict border of the active pattern region D3, the channel active pattern region D2 and the drain electrode active pattern region D1 as described above. The channel active pattern region D2 is finally formed into a channel region 41 in the active layer 40 of the thin film transistor, the drain electrode active pattern region D1 is finally formed into a portion of the active layer 40 in contact with the drain electrode 20, and the source electrode active pattern region D3 is finally formed into a portion of the active layer 40 in contact with the source electrode 30.

Similarly, in the ohmic contact pattern C, the drain electrode ohmic contact region C1, the channel ohmic contact region C2 and the source electrode ohmic contact region C3 are continuous; and a dashed line represents only an approximate border of the drain electrode ohmic contact region C1, the channel ohmic contact region C2 and the source electrode ohmic contact region C3. In the ohmic contact pattern C, the drain electrode ohmic contact region C1 is finally formed into the ohmic contact layer 51 in contact with the drain electrode 20, and the source electrode ohmic contact region C3 is finally formed into the ohmic contact layer 52 in contact with the source electrode 30.

In the fabrication method provided by the at least one embodiment of the present disclosure, before etching the transparent electrode material layer E, the ohmic contact pattern C for forming the ohmic contact layers 51 and 52 are not etched. Because a portion of the transparent electrode material layer E is located above the channel ohmic contact region C2 of the ohmic contact pattern C, even if some residue of the transparent electrode material or the organic matter (e.g., the photoresist) is remained above the channel ohmic contact region C2 after etching the transparent electrode material layer E when the ohmic contact pattern C is etched, the residue of the transparent electrode material or the organic matter on the ohmic contact pattern C can still be completely etched away when the channel ohmic contact region C2 is etched away. Thus, it can be seen that, after the ohmic contact pattern C is etched, and the ohmic contact layers 51 and 52 and the channel region 41 are formed, there is no residue of the transparent electrode material or the organic matter on the channel region 41.

When the transparent electrode material layer E is etched, the ohmic contact pattern C can protect the active pattern D.

It can be seen that, in the array substrate fabricated by using the fabrication method provided by at least one embodiment of the present disclosure, there is no residue of the transparent electrode material or the organic matter left above the channel region 41 of the thin film transistor, and thus, the thin film transistor of the array substrate has a higher reliability and yield.

It is easily understood that, before the intermediate pattern is formed, a gate electrode 60 and a gate insulating layer 70 have been formed on a base substrate of the array substrate. For example, before the intermediate pattern is formed, the fabrication method further comprises steps of: forming a pattern including the gate electrode 60 of the thin film transistor, and then forming the gate insulating layer 70. The intermediate pattern is formed on the gate insulating layer 70.

Those skilled in the art should understand that, the ohmic contact pattern C here may be the so-called "N+ layer" in the related art. For example, the transparent electrode material layer may be an indium tin oxide (i.e., ITO) layer, and the source electrode 30 and drain electrode 20 may be made of Al, Mo or the like metal. For example, the semiconductor layer may be made of amorphous silicon (i.e., a-Si), and the ohmic contact pattern C may be made of amorphous silicon doped with, for example, N+ impurity (i.e., N+a-Si).

The step of etching the semiconductor layer, the transparent electrode material layer and the doped layer is not specifically limited, as long as desired patterns can be formed. For example, the semiconductor layer, the transparent electrode material layer and the doped layer may be etched by a conventional photoetching process, to obtain the desired patterns.

In at least one embodiment of the present disclosure, the patterning the transparent electrode material layer may be performed as follows.

A first photoresist layer is formed on the transparent electrode material layer E; the first photoresist layer is photoetched (i.e., exposed and developed) by using a first mask, to form a pattern corresponding to the pixel electrode in the first photoresist layer; the transparent electrode material layer E is etched according to the pattern of the first photoresist layer corresponding to the pixel electrode, to obtain the pattern of the pixel electrode 10.

For example, the patterning process of the intermediate pattern may be performed as follows: forming a second photoresist layer on the pattern including the pixel electrode 10; photoetching the second photoresist layer by a second mask, to form a pattern corresponding to the active layer of the thin film transistor and an ohmic contact layer in the second photoresist layer; etching the intermediate pattern according to the pattern of the second photoresist layer corresponding to the active layer of the thin film transistor and the ohmic contact layer, to form a pattern including the active layer of the thin film transistor and a pattern including the ohmic contact layer.

Two masks (the first mask and second mask) are used in the above-described method, and in at least one embodiment of the present disclosure, one mask may also be used to achieve a same effect (i.e., to obtain the pattern including the pixel electrode, the active layer of the thin film transistor, and the ohmic contact layer).

Figure 6:
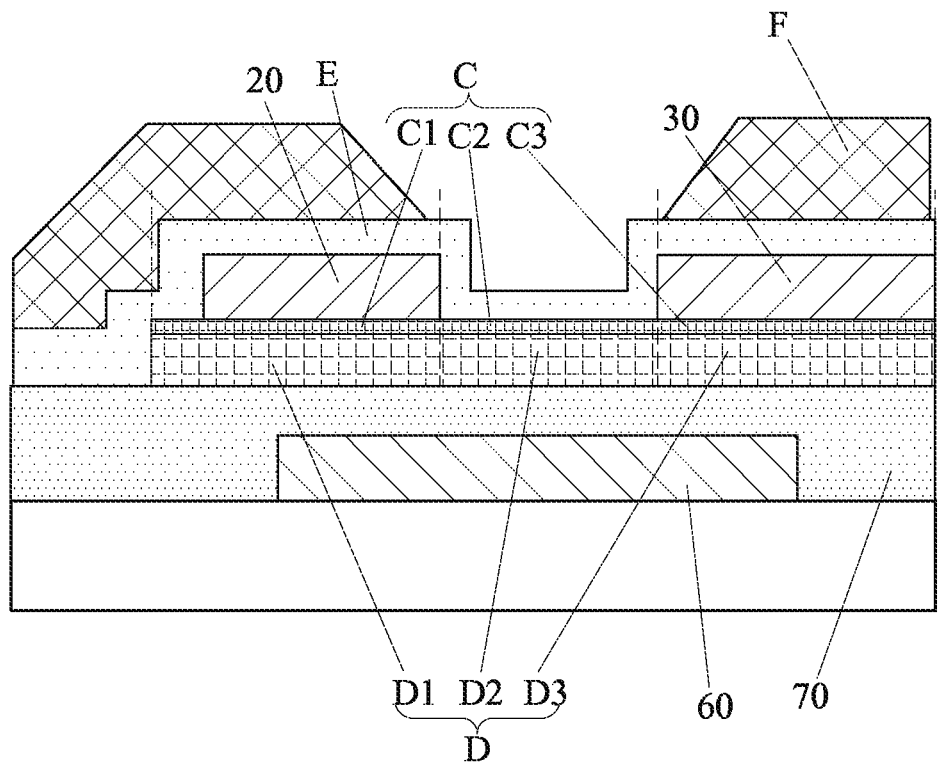

For example, the patterning process of the transparent electrode material layer and the patterning process of the intermediate pattern can be performed synchronously (i.e., the above-described two steps of patterning process can be conducted in a same step), for example, may be performed as follows:

A third photoresist layer F is formed on the transparent electrode material layer E, as show in FIG. 6; the third photoresist layer F is photoetched (i.e., exposed and developed) to form a pattern corresponding to the pixel electrode 10, the active layer 40 of the thin film transistor, and the ohmic contact layers 51 and 52; the transparent electrode material layer E and the intermediate pattern are etched, according to the pattern of the third photoresist layer F corresponding to the pixel electrode 10, the active layer 40 of the thin film transistor, and the ohmic contact layers 51 and 52, so as to obtain a pattern including the active layer 40 of the thin film transistor, the pixel electrode 10 and the ohmic contact layers 51 and 52.

After the pattern including the active layer 40 of the thin film transistor, the pixel electrode 10 and the ohmic contact layer 40 is formed (see FIG. 8), the remained portion of the third photoresist layer F may be stripped, to obtain the array substrate as shown in FIG. 9. Although there is some transparent electrode material left on the source electrode 30, the transparent electrode material is not applied with a gray-scale signal and will not influence the display of the display panel.

The above-described method has saved one mask and one step of photoetching process, and thus, can reduce costs of fabricating the array substrate.

In at least one embodiment of the present disclosure, the step of forming the intermediate pattern is not specifically defined. For example, the process of forming an intermediate pattern may be performed as follows:

An active layer thin film and an ohmic contact layer thin film located on the active layer thin film are formed; the active layer thin film and the ohmic contact layer thin film are patterned to form the intermediate pattern.

For example, the process of forming an active layer thin film and an ohmic contact layer thin film located on the active layer thin film may be performed as follows.

A semiconductor layer is formed; the semiconductor layer is doped to form an active semiconductor layer and a doped layer located on the active semiconductor layer, and the composition of the active semiconductor layer is the same as that of the semiconductor layer.

In the above-described embodiment, the semiconductor layer may be made of an amorphous silicon material, and the amorphous silicon material may be deposited on the substrate by evaporation or sputtering, etc. Here, "patterning the active semiconductor layer and the doped layer" may be conducted by a conventional photoetching process. That is, the photoresist is coated on the doped layer, and then the formed photoresist layer is photoetched (exposed and developed) by a mask, so that a pattern corresponding to the intermediate pattern is formed on the photoresist layer, and then the doped layer and the active semiconductor layer are etched with the exposed and developed photoresist as an etching mask, to form the intermediate pattern.

In order to reduce the process steps and lower the process cost, for example, the step of forming the intermediate pattern and the step of forming a pattern including a source electrode and a drain electrode of the thin film transistor may be performed synchronously, for example, performed as follows:

A semiconductor layer is formed; the semiconductor layer is doped to form the active semiconductor layer and the doped layer located on the active semiconductor layer, and the composition of the active semiconductor layer is the same as that of the semiconductor layer; a source-drain metal layer is formed on the doped layer; a fourth photoresist layer is formed on the source-drain metal layer; the fourth photoresist layer is photoetched (i.e., exposed and developed) with a half-tone mask, to form a pattern corresponding to the source electrode and the drain electrode of the thin film transistor and the intermediate pattern; the source-drain metal layer, the doped layer and the active semiconductor layer are etched, according to the pattern of the fourth photoresist layer corresponding to the source electrode and the drain electrode of the thin film transistor and the intermediate pattern, so as to obtain a pattern including the source electrode and the drain electrode of the thin film transistor and the intermediate pattern.

As compared with the above-described process of forming the intermediate pattern and the pattern including the source electrode and the drain electrode of the thin film transistor respectively, this embodiment saves the step of coating photoresist and saves the step of using the mask, which simplifies the steps of the entire fabrication method and reduces the costs. In addition to the above-described advantages, an advantage of the method provided by this embodiment also rests with that only one layer of photoresist (i.e., the fourth photoresist layer) is coated. Therefore, after the channel ohmic contact region C2 of the ohmic contact pattern C is etched away, no photoresist will be applied onto the surface of the active pattern D, so that the residue of organic matter on the channel region is completely avoided.

In at least one embodiment of the present disclosure, thicknesses of the respective layers of materials are not specifically limited, for example, the active semiconductor layer may have a thickness set between 1500 Å and 2300 Å. The doped layer may have a thickness set between 400 Å and 600 Å. In the step of patterning the intermediate pattern, after the channel ohmic contact region is removed, the removed portion of the material of the channel active pattern region has a thickness of 900 Å to 1100 Å, so as to obtain the channel region.

In the array substrate fabricated by using the fabrication method provided by at least one embodiment of the present disclosure, the channel region 41 of the thin film transistor may have a thickness between 500 Å and 1500 Å. When the active pattern D with a thickness of 2300 Å and the ohmic contact pattern C with a thickness of 500 Å are etched, firstly, the portion in the ohmic contact pattern C corresponding to the channel region 41 (the channel ohmic contact region C2) is completely etched away, and then the portion on the active pattern D corresponding to the channel region 41 (i.e., the channel active pattern region D2) is etched by 1000 Å, so that the channel region 41 with a thickness of 1300 Å can be obtained.

At least one embodiment of the present disclosure provides an array substrate; the array substrate is fabricated by using the fabrication method provided by the above-described embodiments of the present disclosure. As described above, in the fabrication method provided by at least one embodiment of the present disclosure, before etching the transparent electrode material layer E, the channel ohmic contact region C2 in the ohmic contact pattern C corresponding to the channel region is not etched away. Since the transparent electrode material layer E is located above the ohmic contact pattern C, even if the transparent electrode material layer E is etched and there is some residue of the transparent electrode material or the organic matter (e.g., photoresist) above the channel ohmic contact region C2 in the ohmic contact pattern C corresponding to the channel region, when the ohmic contact pattern C is etched, the residue of the transparent electrode material or the organic matter on the channel ohmic contact region C2 can still be completely etched away, and thus, after the ohmic contact pattern C is etched and the ohmic contact layers 51 and 52 and the channel region 41 are formed, there is no residue of the transparent electrode material or the organic matter on the channel region 41.

In the array substrate provided by at least one embodiment of the present disclosure, the channel region of the thin film transistor has a thickness between 500 Å and 1500 Å.

At least one embodiment of the present disclosure provides a display panel, the display panel comprising an array substrate, and the array substrate is the above-described array substrate provided by the present disclosure.

Because the thin film transistor of the array substrate has a higher reliability and yield, the display panel comprising the array substrate also has a higher yield, and has a better display effect.

It is easily understood that, the display panel further comprises a cell-assemble substrate which is cell-assembled with the array substrate. The display panel may be used in electronic devices such as a mobile phone, a computer and the like.

The foregoing embodiments merely are exemplary embodiments of the disclosure, and not intended to define the scope of the disclosure, and the scope of the disclosure is determined by the appended claims.

The present application claims priority of Chinese Patent Application No. 201410421632.5 filed on Aug. 25, 2014, the disclosure of which is incorporated herein by reference in its entirety as part of the present application.

The invention claimed is:

1. A fabrication method of an array substrate, the array substrate comprising a thin film transistor, the fabrication method comprising:

forming an intermediate patter, the intermediate pattern including an active pattern and an ohmic contact pattern located on the active pattern, the active pattern including a source electrode active pattern region, a drain electrode active pattern region, and a channel active pattern region located between the source electrode active patter region and the drain electrode active pattern region, the ohmic contact pattern region including a source electrode ohmic contact region located on the source electrode active pattern region, a drain electrode ohmic contact region located on the drain electrode active patter region, and a channel ohmic contact region located on the channel active pattern region;

forming a pattern including a source electrode and a drain electrode of the thin film transistor, the source electrode and the drain electrode of the thin film transistor being located above a doped layer;

forming a transparent electrode material layer, the transparent electrode material layer covering a substrate including the pattern of the source electrode and the drain electrode of the thin film transistor;

patterning the transparent electrode material layer to form a patter including a pixel electrode; and patterning the intermediate pattern, to remove the channel ohmic contact region, and to remove a portion of a material of the channel active pattern region, so as to form an active layer of the thin film transistor;

wherein, patterning of the transparent electrode material layer comprises:

forming a first photoresist layer on the transparent electrode material layer;

photoetching the first photoresist layer by a first mask, to form a pattern corresponding to the pixel electrode in the first photoresist layer; and etching the transparent electrode material layer according to the pattern of the first photoresist layer corresponding to the pixel electrode, to obtain the pattern of the pixel electrode;

wherein, patterning of the intermediate pattern includes:

forming a second photoresist layer on the pattern including the pixel electrode;

photoetching the second photoresist layer by a second mask, to form a pattern corresponding to the active layer of the thin film transistor and an ohmic contact layer in the second photoresist layer; and etching the intermediate pattern according to the pattern of the second photoresist layer corresponding to the active layer of the thin film transistor and the ohmic contact layer, to form a pattern including the active layer of the thin film transistor and a pattern including the ohmic contact layer;

wherein, the first photoresist layer is different to the second photoresist layer.

2. The fabrication method of the array substrate according to claim 1, wherein, forming a third photoresist layer on the transparent electrode material layer;

photoetching the third photoresist layer, to form a pattern corresponding to the pixel electrode, the active layer of the thin film transistor and the ohmic contact layer; and etching the transparent electrode material layer and the intermediate pattern according to the pattern of the third photoresist layer corresponding to the pixel electrode, the active layer of the thin film transistor and the ohmic contact layer, to obtain a pattern including the active layer of the thin film transistor, the pixel electrode and the ohmic contact layer.

3. The fabrication method according to claim 1, wherein, forming of the intermediate pattern comprises:

forming an active layer thin film and an ohmic contact layer thin film located on the active layer thin film; and patterning the active layer thin film and the ohmic contact layer thin film, to form the intermediate pattern.

4. The fabrication method according to claim 1, wherein, forming of the intermediate pattern and forming of the pattern including the source electrode and the drain electrode of the thin film transistor are performed in a same etching process.

5. The fabrication method according to claim 1, wherein, during patterning the intermediate pattern, after the channel ohmic contact region is removed, a removed portion of material of the channel active pattern region has a thickness between 900 Å and 1100 Å.

6. An array substrate, the array substrate being fabricated by using the fabrication method according to claim 1.

7. The array substrate according to claim 1, wherein, a channel region of the thin film transistor has a thickness between 500 Å and 1500 Å.

8. A display panel comprising the array substrate according to claim 6.

9. The fabrication method according to claim 1, wherein, the patterning the transparent electrode material layer and the patterning the intermediate pattern are performed in a same etching process.

10. The fabrication method according to claim 4, wherein, forming a semiconductor layer;

doping the semiconductor layer, to form an active semiconductor layer and the doped layer located on the active semiconductor layer;

forming a source-drain metal layer above the doped layer;

forming a fourth photoresist layer on the source-drain metal layer;

photoetching the fourth photoresist layer by using a half-tone mask, to form a pattern corresponding to the source electrode and the drain electrode of the thin film transistor and the intermediate pattern;

etching the source-drain metal layer, the doped layer and the active semiconductor layer, according to the pattern of the fourth photoresist layer corresponding to the source electrode and the drain electrode of the thin film transistor and the intermediate pattern, to obtain a pattern including the source electrode and the drain electrode of the thin film transistor and the intermediate pattern.

11. The fabrication method according to claim 10, wherein, the active semiconductor layer has a thickness between 1500 Å and 2300 Å.

* * * * *